(12) United States Patent
Saito

(10) Patent No.: US 6,388,269 B1
(45) Date of Patent: May 14, 2002

(54) METAL INTERCONNECTION STRUCTURE FOR EVALUATION ON ELECTROMIGRATION

(75) Inventor: Yumi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/535,971

(22) Filed: Mar. 27, 2000

(30) Foreign Application Priority Data

Mar. 25, 1999 (JP) .......................................... 11-082030

(51) Int. Cl.[7] .......................... H01L 23/48; H01L 29/40
(52) U.S. Cl. .......................... 257/48; 257/767; 257/773
(58) Field of Search .......................... 257/48, 740, 773, 257/767, 774; 324/766

(56) References Cited

U.S. PATENT DOCUMENTS

| | | | | |
|---|---|---|---|---|
| 5,382,831 A | * | 1/1995 | Atakov et al. | 257/767 |
| 5,472,911 A | * | 12/1995 | Dreye et al. | 437/187 |
| 5,612,627 A | * | 3/1997 | Bui et al. | 324/766 |
| 5,689,139 A | * | 11/1997 | Bui et al. | 257/758 |
| 5,760,476 A | * | 6/1998 | Varker et al. | 257/767 |
| 6,221,794 B1 | * | 4/2001 | Pangrle et al. | 438/792 |

* cited by examiner

Primary Examiner—Jerome Jackson, Jr.
(74) Attorney, Agent, or Firm—Young & Thompson

(57) ABSTRACT

The present invention provides a novel metal interconnection structure for evaluation on electromigration thereof, wherein a test metal interconnection to be evaluated on electromigration is connected through a plurality of bamboo-structured metal interconnections to a plug metal interconnection, and the bamboo-structured metal interconnection has a smaller sectioned area than the test metal interconnection while the plug metal interconnection has a larger sectioned area than the test metal interconnection.

8 Claims, 9 Drawing Sheets

Cathode side

METAL INTERCONNECTION STRUCTURE FOR EVALUATION ON ELECTROMIGRATION

BACKGROUND OF THE INVENTION

The present invention relates to a metal interconnection structure for evaluation on electromigration appeared therein, and more particularly to a metal interconnection structure for evaluation on reliability of a semiconductor device.

The electromigration has been known to be a phenomenon that metal ions in the metal interconnection in the semiconductor device are moved by exchange in momentum between electrons as current carriers flowing through the metal interconnection and the metal ions in the metal interconnection under an increased current density of the metal interconnection and/or an increased device temperature due to an increased power for each chip. The electromigration may cause a local formation of voids in the metal interconnection, whereby a resistance of the metal interconnection is increased and a disconnection to the metal interconnection appears. Namely, the electromigration deteriorates the reliability of the semiconductor device. For those reasons, it is important to do an evaluation on the electromigration of the metal interconnection of the semiconductor device.

FIG. 1 is a fragmentary plane view illustrative of a metal interconnection and a plug interconnection for connection to an electrode pad to conduct an electromigration-evaluation test. A plug interconnection 22 made of aluminum has a width wider than a metal interconnection 21 made of aluminum as a sample for evaluation on electromigration. The test is made by applying a current through the plug interconnection 22 and the metal interconnection 21, whereby electrons 25 move in a direction from the plug interconnection 22 to the metal interconnection 21, and also aluminum atoms 26 are moved by exchange in momentum with the electrons 25. Namely, the aluminum atoms 26 flow from the plug interconnection 22 to the metal interconnection 21. As described above, the plug interconnection 22 is wider than the metal interconnection 21. The plug interconnection 22 serves as a large aluminum atom donor which supplies aluminum atoms 26 to the metal interconnection 21. Supply of aluminum atoms 26 from the plug interconnection 22 to the metal interconnection 21 compensates electromigration of the metal interconnection 21, thereby disturbing the evaluation on electromigration.

In order to suppress that the aluminum atoms 26 in the plug interconnection 22 are moved into the metal interconnection 21, it was proposed that opposite ends of the metal interconnection 21 are terminated with other metal than aluminum. FIG. 2A is a fragmentary plane view illustrative of another connection structure of plug vias between an aluminum interconnection for evaluation on electromigration and an aluminum plug interconnection. FIG. 2B is a fragmentary cross sectional elevation view illustrative of the other connection structure of plug vias between an aluminum interconnection for evaluation on electromigration and an aluminum plug interconnection as shown in FIG. 2A. An aluminum interconnection 21 for evaluation on electromigration is connected through tungsten plug vias 24 to an aluminum plug interconnection 22. A current is applied from the aluminum plug interconnection 22 to the aluminum interconnection 21. The current causes aluminum atoms in the aluminum plug interconnection 22 to move toward one end thereof which is connected through the tungsten plug vias 24 to the aluminum interconnection 21. The aluminum atoms do not move through the tungsten plug vias 24 to the aluminum interconnection 21. The current flows from the aluminum plug interconnection 22 through the tungsten plug vias 24 to the aluminum interconnection 21. Aluminum atoms 26 in the aluminum interconnection 21 are moved by the electromigration without any supply of aluminum atoms from the aluminum plug interconnection 22. A discontinuation in flow of aluminum atoms causes the electromigration in the boundary between the aluminum interconnection and the tungsten plug vias. This electromigration forms voids. The movement of aluminum atoms by the electromigration is due to a drift of aluminum atoms in the aluminum interconnection.

The first test pattern shown in FIG. 1 has the following problems. The aluminum interconnection 21 to be evaluated on electromigration is connected with the wide aluminum plug interconnection 22 which is connected with the electrode pad not illustrated. Crystal grains 23 exist in not only the aluminum interconnection 21 but also the aluminum plug interconnection 22. Namely, aluminum atoms are likely to move along the crystal grains 23 not only in the aluminum interconnection 21 but also in the aluminum plug interconnection 22. The aluminum atoms flow from the aluminum plug interconnection 22 into the aluminum interconnection 21. This means that the aluminum atoms are supplied from the aluminum plug interconnection 22 into the aluminum interconnection 21, whereby even aluminum atoms in the aluminum interconnection 21 are moved by the electromigration, the supply of the aluminum atoms from the aluminum plug interconnection 22 compensate the electromigration in the aluminum interconnection 21, whereby an electromigration life-time is made long. Particularly, if the aluminum interconnection is abutted with a titanium layer, a TiAl alloy exists in the boundary between the aluminum interconnection and the titanium layer. Aluminum atoms are easy to move through a Ti—Al interface. Namely, the aluminum atoms are easily to be supplied into the aluminum interconnection to be evaluated on electromigration. As a result, even the electromigration appears in the aluminum interconnection, externally supplied aluminum atoms may compensate the electromigration to suppress formation of voids in the aluminum interconnection. Further external supply of aluminum atoms into the aluminum interconnection to be evaluated on electromigration results in increase in volume of the aluminum interconnection and in reduction in resistance of the aluminum interconnection.

The second test pattern shown in FIG. 2 has a similar structure to the actual interconnection layout pattern, whereby an accurate evaluation on electromigration life-time of the aluminum interconnection. The second test pattern shown in FIG. 2 is, however, disadvantage in a complicated structure which needs a longer time necessary for forming the test pattern than the first test pattern of FIG. 1. As illustrated in FIG. 2B, the aluminum interconnection 21 to be evaluated on electromigration is formed at a different level from the aluminum plug interconnection 22. Further, the aluminum interconnection 21 and the aluminum plug interconnection 22 are connected to each other through the tungsten plug vias 24. FIG. 3 is a diagram illustrative of variations in resistance of the metal interconnections of the first and second test patterns shown in FIGS. 1 and 2A–2B versus time of electromigration test. The first test pattern remains in resistance due to supply of aluminum atoms from the aluminum plug interconnection and then decreases in resistance due to excess supply of aluminum atoms from the aluminum plug interconnection. Namely, the electromigration appeared in the aluminum interconnection is compensated by the supply of aluminum atoms from the aluminum plug interconnection. The wide aluminum interconnection has a large number of crystal grains which make it easy for aluminum atoms to move through the aluminum interconnection. Aluminum atoms are moved toward an anode whilst voids are moved toward a cathode. The voids are, however, filled up with the aluminum atoms supplied from the aluminum plug interconnection. The second test pattern remains in resistance before the electromigration appears but after the electromigration appears, the resistance increases apparently.

In order to prevent compensation to electromigration by external supply of aluminum atoms, the aluminum interconnection to be evaluated on electromigration is terminated with a different metal from aluminum. The multilevel interconnection structure is disadvantageous in many necessary fabrication steps with long times.

In order to solve the above problems and disadvantages, a different structure for evaluation on electromigration of the aluminum interconnection. FIG. 4 is a plane view illustrative of another conventional structure for evaluation on electromigration of the aluminum interconnection. An aluminum interconnection 21A to be evaluated on electromigration is terminated with two pads 22A, each of which has grid lines which are narrower than the aluminum interconnection 21A. This conventional technique is disclosed in Japanese Patent No. 2666774. Since the pads 22A have grid lines narrower than the aluminum interconnection 21A, electromigration is likely to appear in the wide aluminum interconnection 21A rather than the grid lines of the pads 22A. The pad 22A is longer in life-time than the aluminum interconnection 21A. It is rare that electromigration appears on the grid lines of the pads 22A and voids are formed in the grid lines of the pads 22A. Namely, there is almost no influence to the evaluation on electromigration of the aluminum interconnection 21A. Namely, an accurate evaluation on electromigration of the aluminum interconnection 21A is possible. It is, however, not easy to form the grid lines of the pads 22A. It is somewhat difficult to form the grid lines which are much narrower than the aluminum interconnection 21A. If the grid lines are not so narrower than the aluminum interconnection 21A, then it is possible that the pads 22A having such the grid lines reaches the end of its life-time prior to the aluminum interconnection 21A, whereby the evaluation on electromigration of the aluminum interconnection 21A is no longer possible. In the above Japanese patent publication, the interconnection to be evaluated on electromigration has a bamboo-structure, whereby the interconnection comprises a plurality of narrower parallel lines isolated from each other. The bamboo-structure makes the life-time longer than the pads on opposite ends of the bamboo-structured interconnection, whereby the pads reach the end of these life-time prior to appearance of electromigration in the bamboo-structured interconnection.

In the above circumstances, it had been required to develop a novel free from the above problem.

SUMMARY OF THE INVENTION

Accordingly, it is an object of the present invention to provide a novel metal interconnection structure for evaluation on electromigration free from the above problems.

It is a further object of the present invention to provide a novel metal interconnection structure for accurate evaluation on electromigration.

It is a still further object of the present invention to provide a novel metal interconnection structure for accurate evaluation on electromigration, wherein the metal interconnection structure is fabricated in reduced steps.

The present invention provides a novel metal interconnection structure for evaluation on electromigration thereof, wherein a test metal interconnection to be evaluated on electromigration is connected through a plurality of bamboo-structured metal interconnections to a plug metal interconnection, and the bamboo-structured metal interconnection has a smaller sectioned area than the test metal interconnection whilst the plug metal interconnection has a larger sectioned area than the test metal interconnection.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
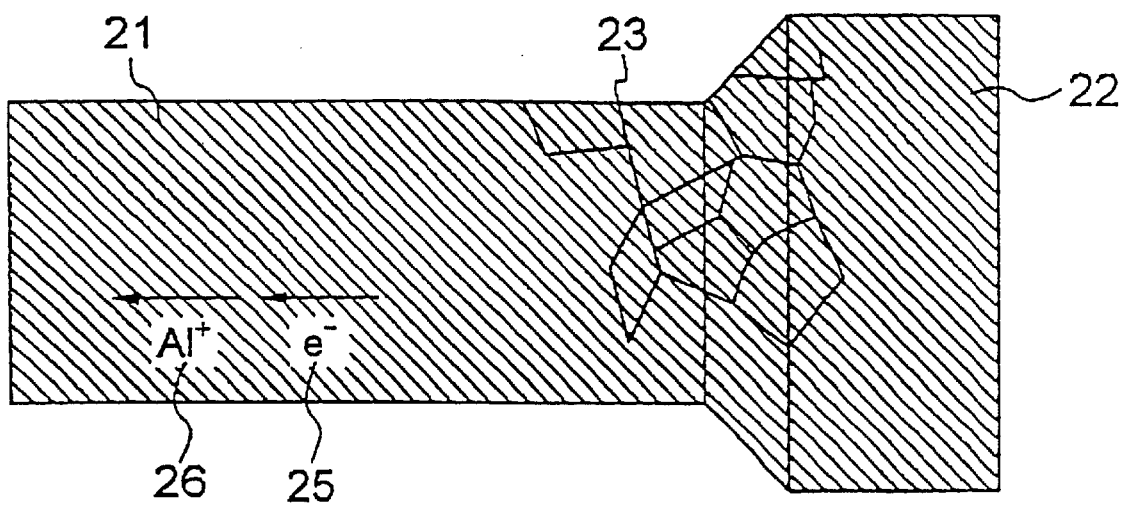
FIG. 1 is a fragmentary plane view illustrative of a metal interconnection and a plug interconnection for connection to an electrode pad to conduct an electromigration-evaluation test.
Figure 2A:
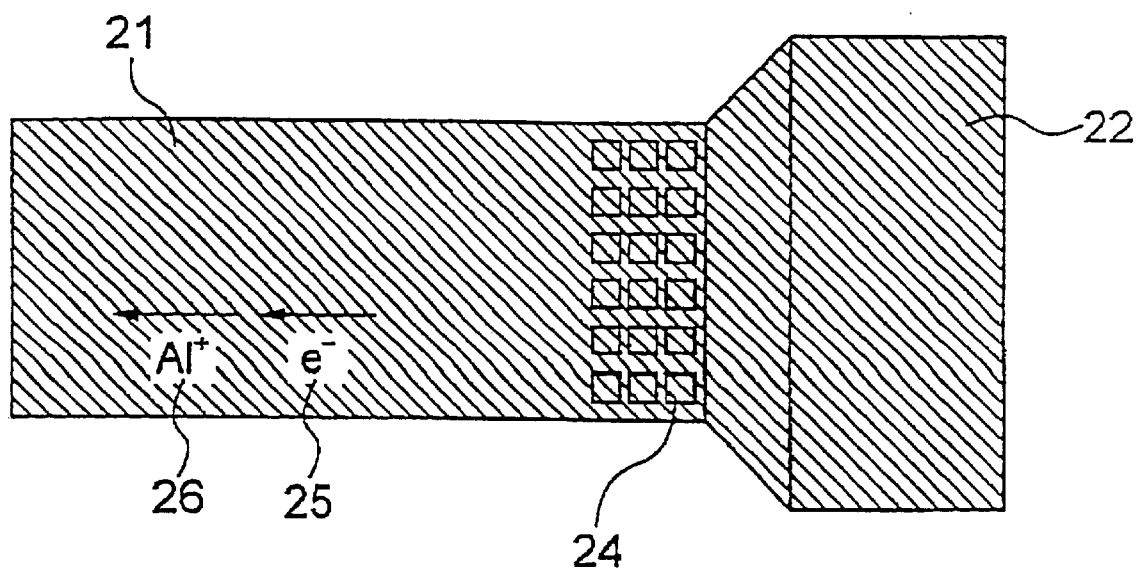
FIG. 2A is a fragmentary plane view illustrative of another connection structure of plug vias between an aluminum interconnection for evaluation on electromigration and an aluminum plug interconnection.
Figure 2B:
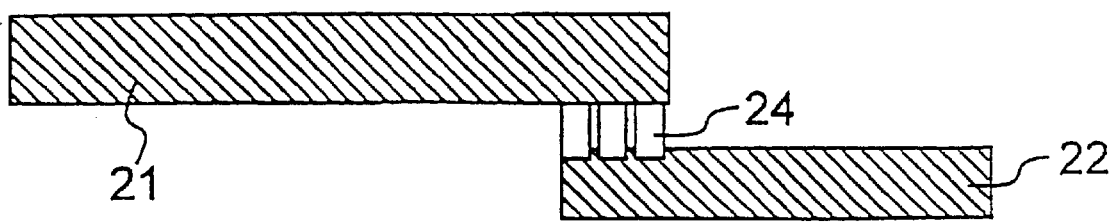
FIG. 2B is a fragmentary cross sectional elevation view illustrative of the other connection structure of plug vias between an aluminum interconnection for evaluation on electromigration and an aluminum plug interconnection as shown in FIG. 2A.
Figure 3:
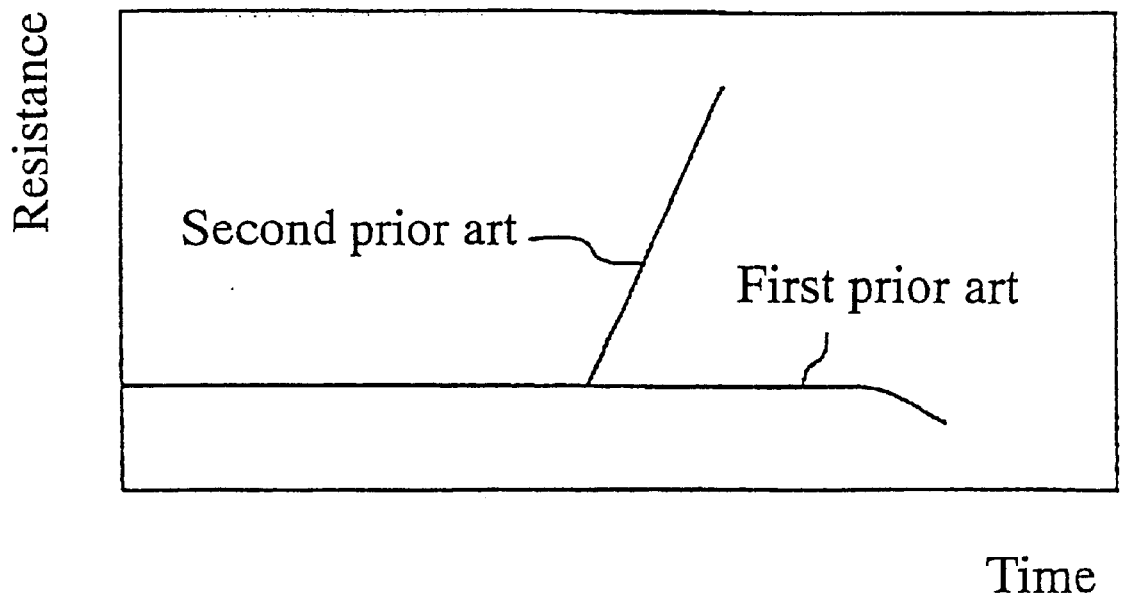
FIG. 3 is a diagram illustrative of variations in resistance of the metal interconnections of the first and second test patterns shown in FIGS. 1 and 2A–2B versus time of electromigration test.
Figure 4:
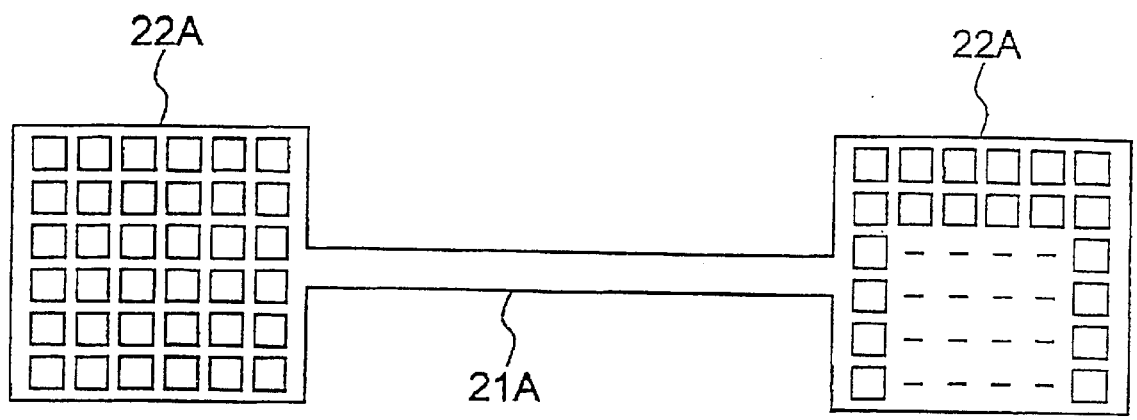
FIG. 4 is a plane view illustrative of another conventional structure for evaluation on electromigration of the aluminum interconnection.

The present invention provides a metal interconnection structure for evaluation on electromigration thereof, wherein a test metal interconnection to be evaluated on electromigration is connected with a plurality of bamboo-structured metal interconnections, and each of the bamboo-structured metal interconnections has a smaller sectioned area than the test metal interconnection.

It is preferable that the plurality of bamboo-structured metal interconnections is connected with a plug metal interconnection, and the plug metal interconnection has a larger sectioned area than the test metal interconnection.

It is further preferable that the plurality of bamboo-structured metal interconnections extend in line from an end of the test metal interconnection.

It is further preferable that a set of the plurality of bamboo-structured metal interconnections has a width of the same as the test metal interconnection.

It is also preferable that plural sets of the plurality of bamboo-structured metal interconnections are connected with at least a side of the test metal interconnection.

It is further preferable that plural sets of the plurality of bamboo-structured metal interconnections are connected with opposite sides of a terminal portion of the test metal interconnection.

It is further preferable that the plural sets of the plurality of bamboo-structured metal interconnections have a total width wider than the test metal interconnection.

It is further preferable that each the plurality of bamboo-structured metal interconnections extends in a direction vertical to a longitudinal direction of the test metal interconnection.

It is further preferable that the test metal interconnection has a width in the range of 4–20 micrometers, and each of the plurality of bamboo-structured metal interconnections has a width in the range of not more than 1 micrometer.

The present invention provides a novel metal interconnection structure for evaluation on electromigration thereof, wherein a test metal interconnection to be evaluated on electromigration is connected through a plurality of bamboo-structured metal interconnections to a plug metal interconnection, and the bamboo-structured metal interconnection has a smaller sectioned area than the test metal interconnection whilst the plug metal interconnection has a larger sectioned area than the test metal interconnection.

The metal interconnection to be evaluated on electromigration has a width in the range of 4–20 micrometers. Crystal grains are exist in random in the interconnection of 4–20 micrometers in width. Aluminum atoms are likely to move along grain boundaries through the metal interconnection.

The metal interconnection is connected through a plurality of bamboo-structured metal interconnections to a plug metal interconnection, and the bamboo-structured metal interconnection has a smaller sectioned area than the test metal interconnection whilst the plug metal interconnection has a larger sectioned area than the test metal interconnection. In the bamboo-structured metal interconnection, crystal grain boundaries extend in a direction transverse to a longitudinal direction of the bamboo-structured metal interconnection. Aluminum atoms are easy to move along the crystal grain boundaries in the transverse direction to the longitudinal direction of the bamboo-structured metal interconnection. This means that aluminum atoms are hard to move along the longitudinal direction of the bamboo-structured metal interconnection. Electrons are, however, easy to move along the longitudinal direction of the bamboo-structured metal interconnection. The bamboo-structure allows electrons to move from the plug metal interconnection through the bamboo-structured metal interconnection to the test interconnection to be evaluated on electromigration. The bamboo-structure prevents aluminum atoms in the plug metal interconnection from passing through the bamboo-structured metal interconnection and from entering into the test interconnection to be evaluated on electromigration.

Aluminum atoms are easy to move through the wide test interconnection whilst aluminum atoms are hard to move through a plurality of the narrow bamboo-structured metal interconnections. Namely, the plurality of the narrow bamboo-structured metal interconnections suppress the supply of aluminum atoms from the plug metal interconnection into the test metal interconnection but allow the current of electrons to the test metal interconnection, whereby voids are likely to be formed in the test metal interconnection particularly near the plurality of the bamboo-structured metal interconnections, without compensation to the electromigration. Namely, the plurality of the narrow bamboo-structured metal interconnections enables the required accurate evaluation on electromigration of the test metal interconnection.

Although the above descriptions are directed to the electromigration of metal interconnection, the above novel structure of the plurality of the bamboo-structured metal interconnections may be applied to other metal interconnections.

Whereas in the above descriptions, the test metal interconnection is connected through the plurality of the bamboo-structured metal interconnections to the plug metal interconnection which is further connected with the electrode pad, it is possible that the test metal interconnection is connected through the plurality of the bamboo-structured metal interconnections to the electrode pad.

PREFERRED EMBODIMENT

First Embodiment

Figure 5:
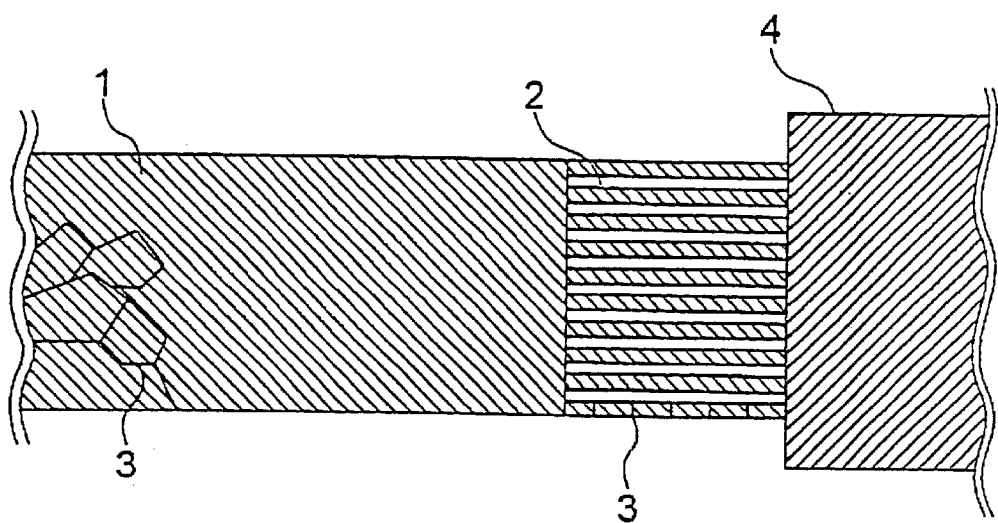
FIG. 5 is a fragmentary plane view illustrative of a novel metal interconnection structure for evaluation on electromigration of a test metal interconnection before electromigration appears in a first embodiment in accordance with the present invention.
Figure 6:
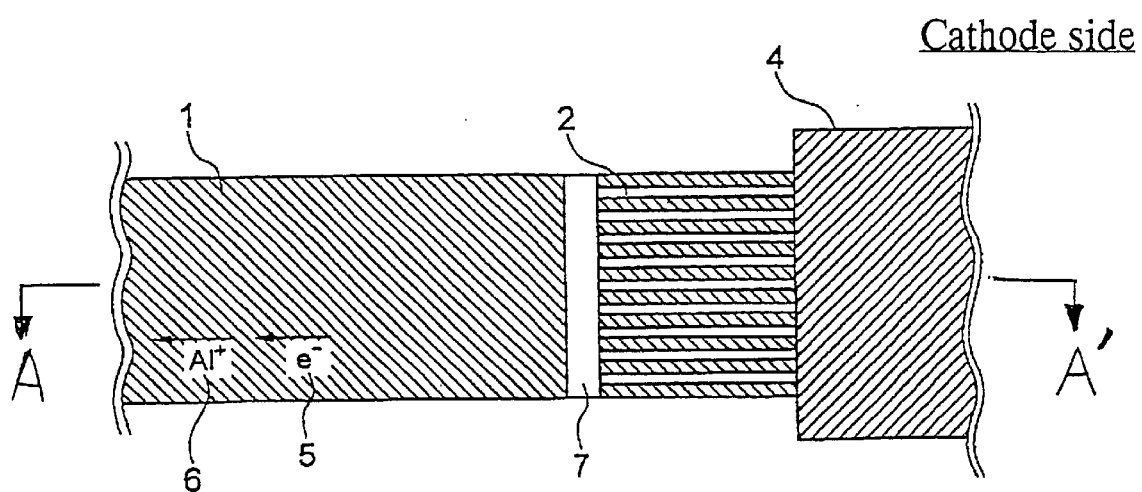
FIG. 6 is a fragmentary plane view illustrative of a novel metal interconnection structure for evaluation on electromigration of a test metal interconnection after electromigration has appeared in a first embodiment in accordance with the present invention.
Figure 7:
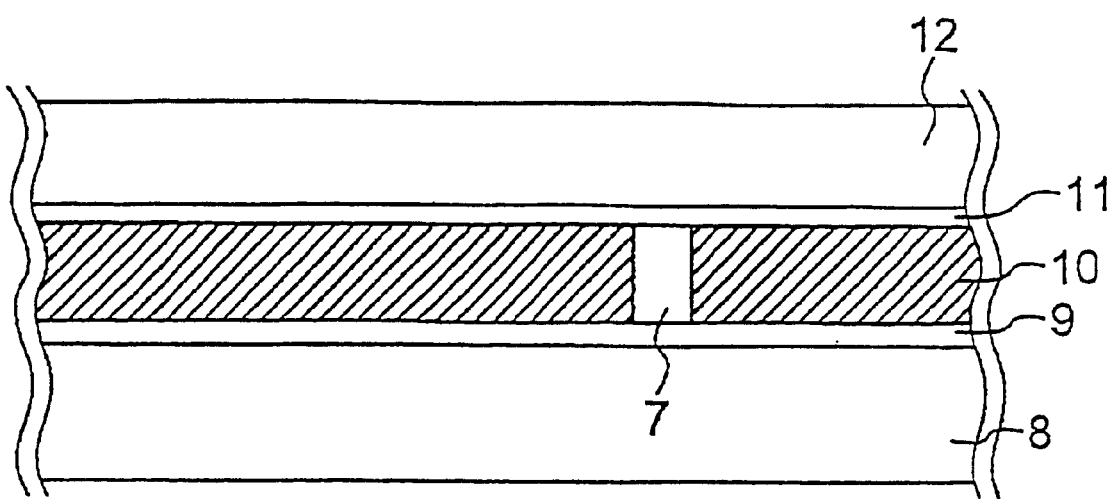
FIG. 7 is a fragmentary cross sectional elevation view taken along an A–A' line of FIG. 6 illustrative of a novel metal interconnection structure for evaluation on electromigration of a test metal interconnection after electromigration has appeared.

A first embodiment according to the present invention will be described in detail with reference to the drawings. FIG. 5 is a fragmentary plane view illustrative of a novel metal interconnection structure for evaluation on electromigration of a test metal interconnection before electromigration appears in a first embodiment in accordance with the present invention. FIG. 6 is a fragmentary plane view illustrative of a novel metal interconnection structure for evaluation on electromigration of a test metal interconnection after electromigration has appeared in a first embodiment in accordance with the present invention. FIG. 7 is a fragmentary cross sectional elevation view taken along an A–A' line of FIG. 6 illustrative of a novel metal interconnection structure for evaluation on electromigration of a test metal interconnection after electromigration has appeared.

A test metal interconnection 1 to be evaluated on electromigration is connected through a plurality of bamboo-structured metal interconnections 2 to a plug metal interconnection 4. The plurality of bamboo-structured metal interconnections 2 are connected with an end of the test metal interconnection 1. A set of the bamboo-structured metal interconnections 2 extends in line from the end of the bamboo-structured metal interconnections 2. A width of the set of the bamboo-structured metal interconnections 2 is the same as a width of the test metal interconnection 1. Each of the bamboo-structured metal interconnections 2 has a width much narrower than the test metal interconnection 1 or has a smaller sectioned area than the test metal interconnection 1. The plug metal interconnection 4 has a width wider than the test metal interconnection 1 or has a larger sectioned area than the test metal interconnection 1. Crystal grains 3 exist in the test metal interconnection 1. Each of the bamboo-structured metal interconnections 2 is so narrow that crystal grain boundaries extend to traverse each of the bamboo-structured metal interconnections 2. The test metal interconnection 1 is connected through the plural bamboo-structured metal interconnections 2 to the plug metal interconnection 4 which is further connected to an electrode pad not illustrated. Electrons flow from the plug metal interconnection 4 through the bamboo-structured metal interconnections 2 to the test metal interconnection 1.

As illustrated in FIG. 7, the test metal interconnection 1 and the plural bamboo-structured metal interconnections 2 are formed at the same level so that the test metal interconnection 1 and the plural bamboo-structured metal interconnections 2 extend over a silicon oxide film 8 and under a silicon oxide film 12 as a passivation film. The test metal interconnection 1 and the plural bamboo-structured metal interconnections 2 have a three-layered structure which comprises a TiN/Ti layer 9, an AlCu layer 10 on the TiN/Ti layer 9 and a TiN layer 11 on the AlCu layer 10.

The test metal interconnection 1 to be evaluated on electromigration has a width of 8 micrometers. The AlCu layer 10 has a thickness of 400 nanometers. Each of the plural bamboo-structured metal interconnections 2 has a width of 0.4 micrometers.

A current is applied to the test metal interconnection 1 at a current density of about 2E6 A/cm$^2$ and also applied to the plural bamboo-structured metal interconnections 2 at a current density of about 4E6 A/cm$^2$. The TiN/Ti layer 9 and the TiN layer 11 are higher in resistivity than the AlCu layer 10. A majority of the current flows through the AlCu layer 10.

Crystal grains are exist in random in the test metal interconnection 1. Aluminum atoms are likely to move along grain boundaries through the test metal interconnection 1. Crystal grain boundaries extend to traverse each of the plural bamboo-structured metal interconnections 2. Aluminum atoms are easy to move along the crystal grain boundaries in the transverse direction to the longitudinal direction of the bamboo-structured metal interconnections 2. This means that aluminum atoms are hard to move along the longitudinal direction of the bamboo-structured metal interconnections 2. Electrons are, however, easy to move along the longitudinal direction of the bamboo-structured metal interconnection 2. The bamboo-structure allows electrons to move from the plug metal interconnection 4 through the bamboo-structured metal interconnections 2 to the test metal interconnection 1 to be evaluated on electromigration. The bamboo-structure prevents aluminum atoms in the plug metal interconnection 4 from passing through the bamboo-structured metal interconnections 2 and from entering into the test metal interconnection 1 to be evaluated on electromigration.

Aluminum atoms are easy to move through the wide test metal interconnection 1 whilst aluminum atoms are hard to move through a plurality of the narrow bamboo-structured metal interconnections 2. Namely, the plurality of the narrow bamboo-structured metal interconnections 2 suppress the supply of aluminum atoms from the plug metal interconnection into the test metal interconnection but allow the current of electrons to the test metal interconnection 1, whereby a drift speed of the aluminum atoms in the test metal interconnection 1 is much higher than a drift speed of the aluminum atoms in the narrow bamboo-structured metal interconnections 2. A large difference in drift speed of the aluminum atoms between the test metal interconnection 1 and the bamboo-structured metal interconnections 2 causes formation of voids 7 in the test metal interconnection 1 particularly but near the plurality of the bamboo-structured metal interconnections. The aluminum atoms remain in drift speed in the test metal interconnection 1, for which reason even if voids are formed by the drift or movement of the aluminum atoms in the test metal interconnection 1, then the voids are likely to be filled with other aluminum atoms drifted or moved from a cathode side, whereby substantially no voids are formed on the test metal interconnection 1 except in the vicinity of the bamboo-structured metal interconnections 2. The voids 7 causes a voltage increase, whereby the formation of the voids in the test metal interconnection 1 by the electromigration can be detected. Namely, the plurality of the narrow bamboo-structured metal interconnections 2 enable the required accurate evaluation on electromigration of the test metal interconnection.

Second Embodiment

Figure 8:
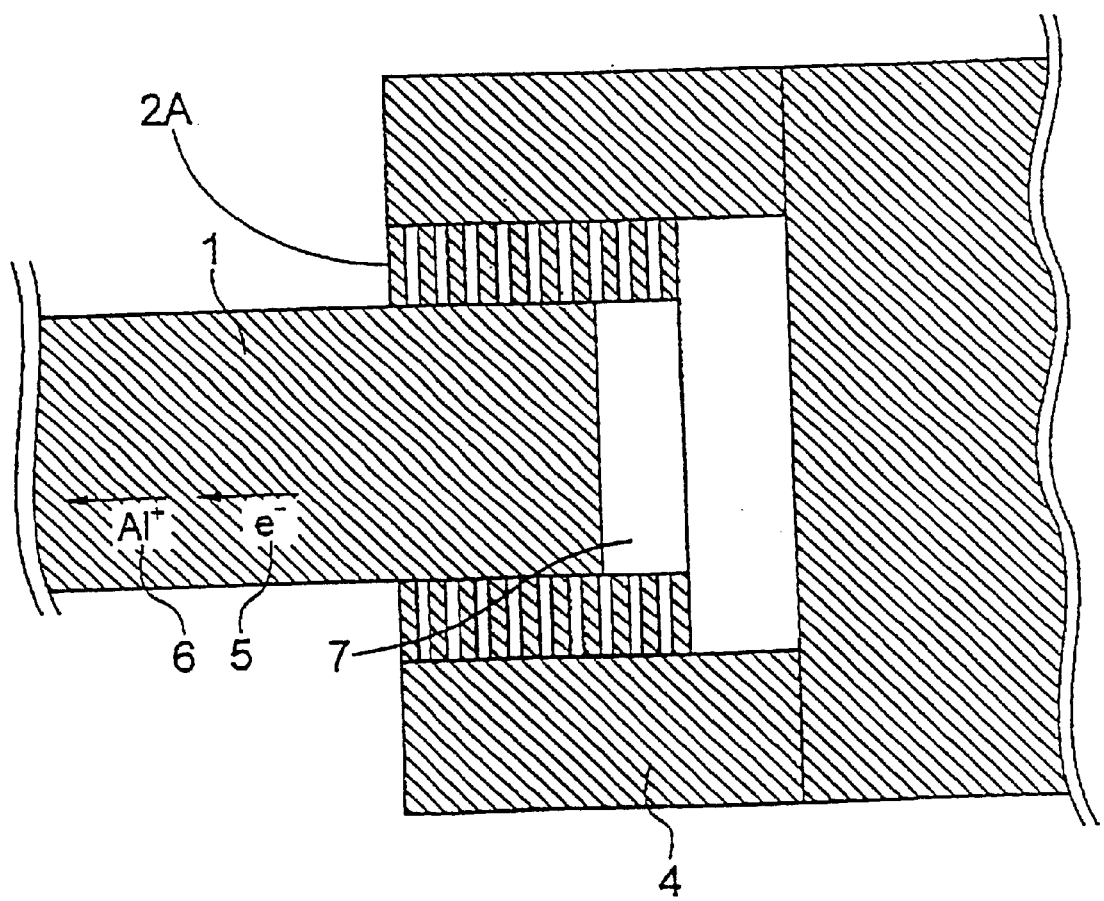
FIG. 8 is a fragmentary plane view illustrative of a novel metal interconnection structure for evaluation on electromigration of a test metal interconnection before electromigration appears in a second embodiment in accordance with the present invention.

A second embodiment according to the present invention will be described in detail with reference to the drawings. FIG. 8 is a fragmentary plane view illustrative of a novel metal interconnection structure for evaluation on electromigration of a test metal interconnection before electromigration appears in a second embodiment in accordance with the present invention.

A test metal interconnection 1 to be evaluated on electromigration is connected through two sets of a plurality of bamboo-structured metal interconnections 2A to a plug metal interconnection 4. Two sets of the plurality of bamboo structured metal interconnections 2 are connected with opposite sides of a cathode side terminal part of the test metal interconnection 1. Each of the bamboo-structured metal interconnections 2A extends in a direction perpendicular to a longitudinal direction of the test metal interconnection 1. A width of each of the two sets of the bamboo-structured metal interconnections 2A is not necessary to be limited to the same as a width of the test metal interconnection 1. While FIG. 8 illustrates the two sets of bamboo-structured metal interconnections 2A being equal to one another in both width and number, a width of each of the two sets of the bamboo-structured metal interconnections 2A may be optional, so that the number of the bamboo-structured metal interconnections 2A in each set may be optional. It is possible to increase the width of each set of the bamboo-structured metal interconnections 2A in order to increase the number of the individual bamboo-structured metal interconnections 2A. The increase in the number of the individual bamboo-structured metal interconnections 2A reduces a current density of the two sets of the bamboo-structured metal interconnections 2A. The reduction in current density of the two sets of the bamboo-structured metal interconnections 2A suppresses the drift or movement of aluminum atoms through the bamboo-structured metal interconnections 2A due to electromigration.

However, each of the bamboo-structured metal interconnections 2A has a width much narrower than the test metal interconnection 1 or has a smaller sectioned area than the test metal interconnection 1. The plug metal interconnection 4 extends to surround the cathode side terminal part of the test metal interconnection 1, so that the plug metal interconnection 4 is connected through the two sets of the bamboo-structured metal interconnections 2A to the cathode side terminal part of the test metal interconnection 1. Thus, the plug metal interconnection 4 has a width much wider than the test metal interconnection 1 or has a larger sectioned area than the test metal interconnection 1.

The two sets of the bamboo-structured metal interconnections 2A of this embodiment have a larger total width or a larger total sectioned area than the single set of the bamboo-structured metal interconnections 2 straight-extending from the test metal interconnection 1 of the above first embodiment. This means that a current density of the two sets of the bamboo-structured metal interconnections 2A of this embodiment is lower than the current density of the single set of the bamboo-structured metal interconnections 2 straight-extending from the test metal interconnection 1 of the above fist embodiment. The reduction in current density of the bamboo-structured metal interconnections 2A results in reduction of drift or movement of aluminum atoms through the bamboo-structured metal interconnections 2A, thereby reducing the supply of aluminum atoms from the bamboo-structured metal interconnections 2A into the test metal interconnection 1.

Crystal grains 3 exist in the test metal interconnection 1. Each of the bamboo-structured metal interconnections 2A is so narrow that crystal grain boundaries extend to traverse each of the bamboo-structured metal interconnections 2A. The test metal interconnection 1 is connected through the plural bamboo-structured metal interconnections 2A to the plug metal interconnection 4 which is further connected to an electrode pad not illustrated. Electrons flow from the plug metal interconnection 4 through the bamboo-structured metal interconnections 2A to the test metal interconnection 1.

The test metal interconnection 1 and the plural bamboo-structured metal interconnections 2A are formed at the same level so that the test metal interconnection 1 and the plural bamboo-structured metal interconnections 2A extend over a silicon oxide film 8 and under a silicon oxide film 12A as a passivation film. The test metal interconnection 1 and the plural bamboo-structured metal interconnections 2A have a three-layered structure which comprises a TiN/Ti layer 9, an AlCu layer 10 on the TiN/Ti layer 9 and a TiN layer 11 on the AlCu layer 10.

Crystal grains are exist in random in the test metal interconnection I. Aluminum atoms are likely to move along grain boundaries through the test metal interconnection 1. Crystal grain boundaries extend to traverse each of the plural bamboo-structured metal interconnections 2A. Aluminum atoms are easy to move along the crystal grain boundaries in the transverse direction to the longitudinal direction of the bamboo-structured metal interconnections 2A. This means that aluminum atoms are hard to move along the longitudinal direction of the bamboo-structured metal interconnections 2A. Electrons are, however, easy to move along the longitudinal direction of the bamboo-structured metal interconnection 2A. The bamboo-structure allows electrons to move from the plug metal interconnection 4 through the bamboo-structured metal interconnections 2A to the test metal interconnection 1 to be evaluated on electromigration. The bamboo-structure prevents aluminum atoms in the plug metal interconnection 4 from passing through the bamboo-structured metal interconnections 2A and from entering into the test metal interconnection 1 to be evaluated on electromigration.

Aluminum atoms are easy to move through the wide test metal interconnection 1 whilst aluminum atoms are hard to move through a plurality of the narrow bamboo-structured metal interconnections 2A. Namely, the plurality of the narrow bamboo-structured metal interconnections 2A suppress the supply of aluminum atoms from the plug metal interconnection into the test metal interconnection but allow the current of electrons to the test metal interconnection 1, whereby a drift speed of the aluminum atoms in the test metal interconnection 1 is much higher than a drift speed of the aluminum atoms in the narrow bamboo-structured metal interconnections 2A. A large difference in drift speed of the aluminum atoms between the test metal interconnection 1 and the bamboo-structured metal interconnections 2A causes formation of voids 7 in the test metal interconnection particularly but near the plurality of the bamboo-structured metal interconnections. The aluminum atoms remain in drift speed in the test metal interconnection 1, for which reason even if voids are formed by the drift or movement of the aluminum atoms in the test metal interconnection 1, then the voids are likely to be filled with other aluminum atoms drifted or moved from a cathode side, whereby substantially no voids are formed on the test metal interconnection 1 except in the vicinity of the bamboo-structured metal interconnections 2A. The voids 7 causes a voltage increase, whereby the formation of the voids in the test metal interconnection 1 by the electromigration can be detected. Namely, the plurality of the narrow bamboo-structured metal interconnections 2A enable the required accurate evaluation on electromigration of the test metal interconnection.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A metal interconnection structure for evaluation on electromigration thereof, wherein a test metal interconnection to be evaluated on electromigration is connected with two or more sets of a plurality of bamboo-structured metal interconnections, each of said bamboo-structured metal interconnections having a smaller sectioned area than said test metal interconnection, wherein a first of the sets is connected to a first side of a terminal portion of the test metal interconnection, and a second of the sets is connected to a side of the terminal portion of the test metal interconnection opposite the first side.

2. The metal interconnection structure as claimed in claim 1, wherein said plurality of bamboo-structured metal interconnections is connected with a plug metal interconnection, and said plug metal interconnection has a larger sectioned area than said test metal interconnection.

3. The metal interconnection structure as claimed in claim 2, wherein each said plurality of bamboo-structured metal interconnections extends in a direction perpendicular to a longitudinal direction of said test metal interconnection.

4. The metal interconnection structure as claimed in claim 1, wherein said test metal interconnection has a width in the range of 4–20 micrometers, and each of said plurality of bamboo-structured metal interconnections has a width in the range of not more than 1 micrometer.

5. The metal interconnection structure of claim 1, wherein a width of the first set of bamboo-structured metal interconnections is not equal to a width of the second set of bamboo-structured metal interconnections.

6. The metal interconnection structure of claim 1, wherein a number of bamboo-structured metal interconnections in the first set is not equal to a number of bamboo-structured metal interconnections in the second set.

7. A metal interconnection structure for evaluation on electromigration thereof, wherein a test metal interconnection to be evaluated on electromigration is connected with a plurality of bamboo-structured metal interconnections, and each of said bamboo-structured metal interconnections has a smaller sectioned area than said test metal interconnection, wherein said plurality of bamboo-structured metal interconnections is connected with a plug metal interconnection, and said plug metal interconnection has a larger sectioned area than said test metal interconnection, wherein plural sets of said plurality of bamboo-structured metal interconnections are connected with at least a side of said test metal interconnection, wherein plural sets of said plurality of bamboo-structured metal interconnections are connected with opposite sides of a terminal portion of said test metal interconnection.

8. The metal interconnection structure as claimed in claim 7, wherein said plural sets of said plurality of bamboo-structured metal interconnections have a total width wider than said test metal interconnection.

* * * * *